US007994047B1

(12) United States Patent
Woo et al.

(10) Patent No.: US 7,994,047 B1
(45) Date of Patent: Aug. 9, 2011

(54) INTEGRATED CIRCUIT CONTACT SYSTEM

(75) Inventors: Christy Mei-Chu Woo, Cupertino, CA (US); Ning Cheng, San Jose, CA (US); Huade Walter Yao, Livermore, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 878 days.

(21) Appl. No.: 11/286,173

(22) Filed: Nov. 22, 2005

(51) Int. Cl.
*H01L 23/485* (2006.01)

(52) U.S. Cl. ........ 438/627; 438/629; 438/643; 438/653; 438/656; 257/E23.175; 257/E23.152

(58) Field of Classification Search .......... 438/700–703, 438/707–714, 625, 626, 627, 629, 633, 638, 438/643, 653, 687, FOR. 350, 656, FOR. 349; 257/E21.579, E21.584, E21.305
See application file for complete search history.

(56) References Cited

U.S. PATENT DOCUMENTS

| | | | |
|---|---|---|---|
| 5,612,254 A | 3/1997 | Mu et al. | |
| 5,739,579 A | 4/1998 | Chiang et al. | |
| 5,981,395 A * | 11/1999 | Huang et al. | 438/692 |
| 6,077,770 A * | 6/2000 | Hsu | 438/622 |
| 6,306,732 B1 * | 10/2001 | Brown | 438/468 |
| 6,383,917 B1 | 5/2002 | Cox | |
| 6,607,977 B1 * | 8/2003 | Rozbicki et al. | 438/627 |
| 6,764,940 B1 * | 7/2004 | Rozbicki et al. | 438/627 |
| 6,780,762 B2 | 8/2004 | Ireland | |
| 6,853,081 B2 | 2/2005 | Nakamura et al. | |
| 6,905,965 B2 * | 6/2005 | Subrahmanyan et al. | 438/687 |
| 6,958,547 B2 * | 10/2005 | Dubin et al. | 257/774 |
| 7,048,837 B2 * | 5/2006 | Somekh et al. | 204/192.13 |
| 7,241,696 B2 * | 7/2007 | Clevenger et al. | 438/722 |
| 7,842,605 B1 * | 11/2010 | Pradhan et al. | 438/627 |
| 2001/0050439 A1 * | 12/2001 | Graas et al. | 257/763 |
| 2002/0041028 A1 * | 4/2002 | Choi et al. | 257/751 |
| 2002/0195715 A1 * | 12/2002 | Cho | 257/774 |
| 2003/0116427 A1 * | 6/2003 | Ding et al. | 204/192.17 |
| 2003/0203615 A1 * | 10/2003 | Denning et al. | 438/627 |
| 2003/0207560 A1 * | 11/2003 | Dubin et al. | 438/629 |
| 2004/0048461 A1 * | 3/2004 | Chen et al. | 438/629 |
| 2004/0171250 A1 * | 9/2004 | Chiang et al. | 438/653 |
| 2004/0188239 A1 * | 9/2004 | Robison et al. | 204/192.3 |
| 2004/0188842 A1 * | 9/2004 | Takewaka et al. | 257/758 |
| 2004/0211661 A1 * | 10/2004 | Zhang et al. | 204/192.12 |
| 2004/0266175 A1 * | 12/2004 | Chen et al. | 438/629 |
| 2005/0006222 A1 * | 1/2005 | Ding et al. | 204/192.1 |
| 2005/0020080 A1 * | 1/2005 | Chiang et al. | 438/689 |
| 2005/0048767 A1 * | 3/2005 | Matsumoto | 438/629 |
| 2005/0272254 A1 * | 12/2005 | Ding et al. | 438/628 |
| 2006/0024953 A1 * | 2/2006 | Papa Rao et al. | 438/629 |
| 2007/0222076 A1 * | 9/2007 | Fukasawa et al. | 257/751 |
| 2008/0190760 A1 * | 8/2008 | Tang et al. | 204/192.17 |
| 2009/0233438 A1 * | 9/2009 | Ding et al. | 438/627 |
| 2010/0009533 A1 * | 1/2010 | Shaviv et al. | 438/653 |

* cited by examiner

*Primary Examiner* — George Fourson
(74) *Attorney, Agent, or Firm* — Farjami & Farjami LLP

(57) ABSTRACT

An integrated circuit contact system is provided including forming a contact plug in a dielectric and forming a first barrier layer in a trench in the dielectric and on the contact plug. Further, the system includes removing a portion of the first barrier layer from the bottom of the first barrier layer and depositing the portion of the first barrier layer on the sidewall of the first barrier layer, and forming a second barrier layer over the first barrier layer and filling a corner area of the trench.

10 Claims, 5 Drawing Sheets

INTEGRATED CIRCUIT CONTACT SYSTEM

TECHNICAL FIELD

The present invention relates generally to flash memory systems and integrated circuit systems, and more particularly to a flash memory system having an integrated circuit contact system.

BACKGROUND ART

Integrated circuits are used in many portable electronic products, such as cell phone, portable computers, voice recorders, etc. as well as in many larger electronic systems, such as cars, planes, industrial control systems, etc. Across virtually all applications, there continues to be demand for increasing functions and reducing the size of the devices. The intense demand is no more visible than in portable electronics that have become so ubiquitous.

In the manufacture of integrated circuit devices it is necessary to provide electrically conductive contacts and interconnect layers in order to connect electrically various parts of the device to each other and to external circuitry. Manufacturers of integrated circuit devices have appreciated that there is a need further to reduce the size of the devices, such as by reducing the size of the electrical contacts as well as the interconnect pitch, without reducing the reliability of the devices and keeping the surface planar so that subsequent interconnect layers can be formed.

Conventional methods of depositing metal contacts, such as by sputtering, have great difficulty in depositing enough material into the contact holes in order to form reliable electrical connections between the substrate silicon and the metal contact. In addition, the resulting topology is non-planar and can place severe constraints on the complexity of the interconnect layers. This method of manufacturing has the limitation that the contact hole must be wide enough and have the correct profile to allow a limited amount of metal to enter the contact hole to form the contact. The obtainable reduction in size of the contact hole is limited by the step coverage capability of conventional sputtering systems.

In addition, the metal line width has to be large enough to cover the contact by at least the possible misalignment of the pattern so that the contact is protected during etching of the metal to form the desired patterning of the interconnect layer. Furthermore, by making the contact hole large, any subsequent dielectric layer not only has to be capable of covering the non-planar surface resulting from previous interconnect layers but also has to cover the profile of the interconnect material when it goes down into a contact hole. This requires complex and involved techniques for planarizing the next dielectric layer, which must be used if further layers, in particular interconnect layers, are desired.

Thus a need still remains for an integrated circuit contact system to provide increasing density without sacrificing reliability, yield and high volume manufacturing processes. In view of the increasing demand for density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit contact system including forming a contact plug in a dielectric and forming a first barrier layer in a trench in the dielectric and on the contact plug. Further, the system includes removing a portion of the first barrier layer from the bottom of the first barrier layer and depositing the portion of the first barrier layer on the sidewall of the first barrier layer, and forming a second barrier layer over the first barrier layer and filling a corner area of the trench.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
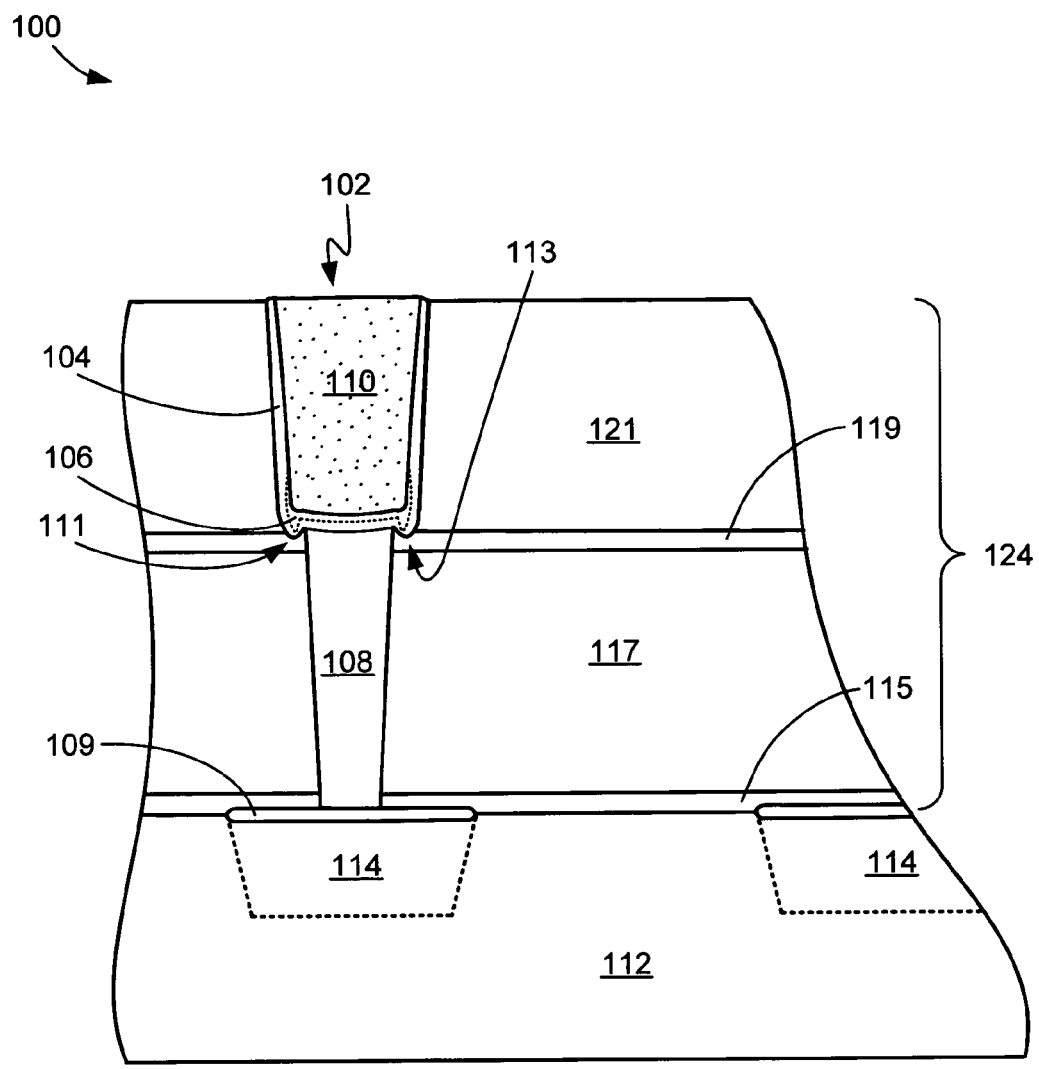
FIG. 1 is a cross-sectional view of a flash memory cell system having an integrated circuit contact system.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. The same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" is defined as one element in direct contact with another element.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a flash memory cell system 100 having an integrated circuit contact system 102. The integrated circuit contact system 102 includes a first barrier layer 104 of a material such as tantalum (Ta) and a second barrier layer 106, which may also of the same material such as tantalum (Ta). The first barrier layer 104 and the second barrier layer 106 are deposited over a contact plug 108, such as a tungsten (W) contact plug.

The contact plug 108 electrically connects a flash memory system, as represented by a flash memory bit line 114, by a silicide or salicide 109 through the first barrier layer 104 and the second barrier layer 106 to an interconnect layer 110 of a high diffusion material such as copper (Cu). The first barrier layer 104 and the second barrier layer 106 or a seed layer (not shown) provide a conductive barrier layer for deposition of the interconnect layer 110. Multiple process steps for the formation of the conductive barrier layer provide improved bias temperature stress, BTS, of the integrated circuit contact system 102.

After the contact plug 108 is formed, the first barrier layer 104 is deposited using a first high power deposition process. The high power is in the range from 15 KW to 30 KW DC, with the best results being obtained around 19 KW. The high power deposition is continuous throughout the deposition and provides a high deposition rate for the deposition of a material such as a tantalum barrier material.

The first high power deposition process deposits approximately 200 angstroms of the first barrier layer 104 above the contact plug 108 and onto a dielectric sidewall. Further, the first high power deposition process provides high bottom step coverage, approximately 70% to 85%, of the first barrier layer 104 above the contact plug 108. Yet further, the first high power deposition process provides a low sidewall step coverage of the first barrier layer 104, approximately 10% to 20%, due to small interconnect line width and tall interconnect feature height of the interconnect layer 110.

To compensate for the low sidewall step coverage of the first high power deposition process, the first barrier layer 104 is re-sputtered. The re-sputtering process deposits approximately 55 angstroms of re-sputtered or dug out material from the existing bottom thickness of the first barrier layer 104. The re-sputtered or dug out material of the first barrier layer 104 is applied to the sidewall to compensate for the low sidewall step coverage of the first high power deposition. The resulting bottom layer thickness of the first barrier layer 104 is significantly thinner at the bottom corners resulting in low bottom corner step coverage in corner areas 111 and 113. It has been discovered that the low bottom corner step coverage becomes so thin that diffusion of material of the interconnect layer 110 through the first barrier layer 104 occurs and causes short circuits to other contact plugs.

It has been further discovered that for low bottom corner step coverage, a second high power deposition process in a manner similar to the first high power deposition process can be used to buildup the barrier material at the corner areas 111 and 113 to prevent diffusion.

The second high power deposition process deposits approximately 75 angstroms to 200 angstroms of the second barrier layer 106 above the contact plug 108. The second barrier layer 106 is applied such that material is substantially applied to the bottom and minimally applied to the sidewalls. The second high power deposition provides high bottom step coverage to compensate for the low bottom corner step coverage as well as low sidewall step coverage to control sheet resistance. Thus, the conductivity of the interconnect layer 110 and the first and second barrier layers 104 and 106 does not increase significantly because higher resistance barrier material is still sufficiently thin around the highly conductive interconnect material to have minimal impact on conductivity.

The integrated circuit contact system 102 is formed in a first etch stop layer 115, a first dielectric layer 117, a second etch stop layer 119, and a second dielectric layer 121. The various layers are collectively referred to as a dielectric 124.

For illustrative purposes the integrated circuit contact system 102 is shown in the flash memory cell system 100, although it is understood that the integrated circuit contact system 102 may be used with other integrated circuit systems, as well. Further, for illustrative purposes the integrated circuit contact system 102 is shown connecting the flash memory bit line 114 with an interconnect layer 110, although it is understood that the integrated circuit contact system 102 may connected other layers, as well.

Figure 2:
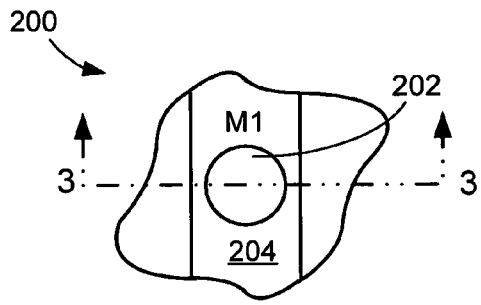
FIG. 2 is a top plan view of an integrated circuit contact system having a contact plug with a wide interconnect trench in an embodiment of the present invention.

Referring now to FIG. 2, therein is shown a top plan view of an integrated circuit contact system 200 having a contact plug 202 with a wide interconnect trench 204 in an embodiment of the present invention. The wide interconnect trench 204 may be intentional, such as a design requirement, or not, such as a result of processing variation. The increased width may also provide improvements for power paths, ground paths, high-speed signals, high-current signals and thermal paths. The increased width may also increase reliability concerns and processing complexity. The wide interconnect trench 204 substantially overlaps the contact plug 202.

Figure 3:
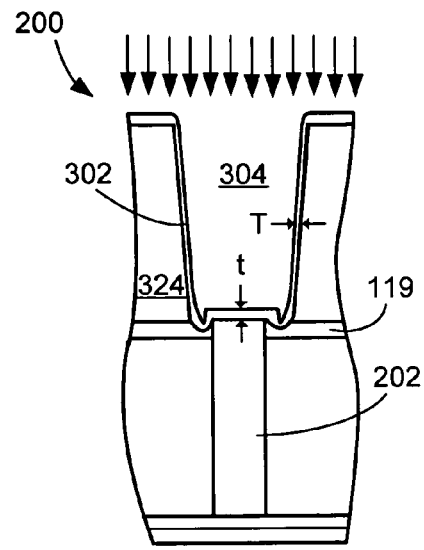
FIG. 3 is a cross-sectional view along line 3-3 of FIG. 2 of the integrated circuit contact system in a first high power deposition phase.

Referring now to FIG. 3, therein is shown a cross-sectional view of the integrated circuit contact system 200 along line 3-3 of FIG. 2 in a first high power deposition phase. A first barrier layer 302 is deposited in a dielectric 324 using a first high power deposition process after the contact plug 202 is formed.

The first high power deposition process deposits approximately 200 angstroms of the first barrier layer 302 above the contact plug 202 and into a trench 304 in the dielectric 324.

Further, the first high power deposition process provides high bottom step coverage, approximately 70% to 85% to a thickness of "t", of the first barrier layer 302 inside the trench 304 and above the contact plug 202. Yet further, the first high power deposition process provides a low sidewall step coverage of the first barrier layer 302, approximately 10% to 20% to a thickness of "T", due to small interconnect line width and tall interconnect feature height.

Figure 4:
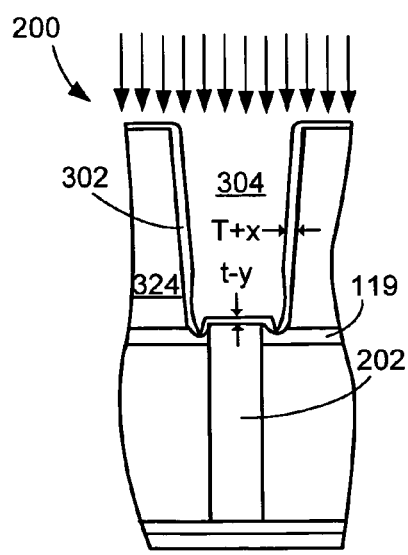
FIG. 4 is a cross-sectional view of the structure of FIG. 3 in a re-sputtering phase.

Referring now to FIG. 4, therein is shown a cross-sectional view the structure of FIG. 3 of the integrated circuit contact system 200 in a re-sputtering phase. To compensate for the low sidewall step coverage of the first high power deposition process, the first barrier layer 302 is re-sputtered.

The re-sputtering process provides re-sputtering or dig out of approximately 55 angstroms, to a thickness of "t" minus "y", of the first barrier layer 302 from the existing bottom thickness of the first barrier layer 302.

The re-sputtered or dug out material of the first barrier layer 302 is applied to the sidewall of the first barrier layer 302 to a thickness of "T"+"x", of the trench 304 to compensate for the low sidewall step coverage of the first high power deposition. The resulting bottom layer thickness of the first barrier layer 302 is significantly thinner at the bottom corners resulting in low bottom corner step coverage.

Figure 5:
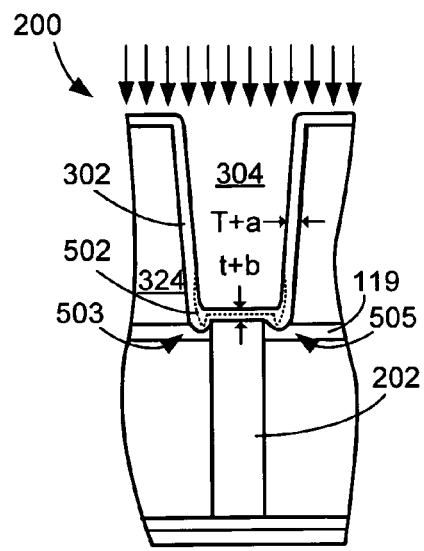
FIG. 5 is a cross-sectional view of the structure of FIG. 4 in a second high power deposition phase.

Referring now to FIG. 5, therein is shown a cross-sectional view the structure of FIG. 4 of the integrated circuit contact system 200 in a second high power deposition phase. For low bottom corner step coverage, a second barrier layer 502 is applied using a second high power deposition process.

The second high power deposition process deposits approximately 75 angstroms to 200 angstroms, to a thickness of "t" plus "b", on the first barrier layer 302 above the contact plug 202. The second barrier layer 502 is applied such that material is substantially applied to the bottom of the trench 304 and minimally applied to the sidewalls of the first barrier layer 302 to a thickness of "T" plus "a". The second high power deposition provides high bottom step coverage to compensate for the low bottom corner step coverage as well as low sidewall step coverage to control sheet resistance. Thus, the barrier material fills corner areas 503 and 505 of the trench 304, which are defined as being below the top of the contact plug 202.

Figure 6:
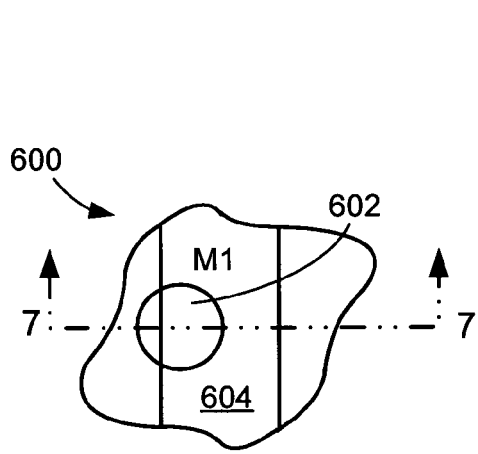
FIG. 6 is a top plan view of an integrated circuit contact system having a contact plug with an offset interconnect layer in an alternative embodiment of the present invention.

Referring now to FIG. 6, therein is shown a top plan view of an integrated circuit contact system 600 having a contact plug 602 with an offset interconnect layer 604 in an alternative embodiment of the present invention. The offset interconnect layer 604 may be intentional, such as a design requirement, or not, such as a result of processing variation. The offset may also provide improvements for delay paths and area sensitive paths. The offset may also increase reliability concerns and processing complexity. The offset interconnect layer 604 partially overlaps the contact plug 602.

Figure 7:
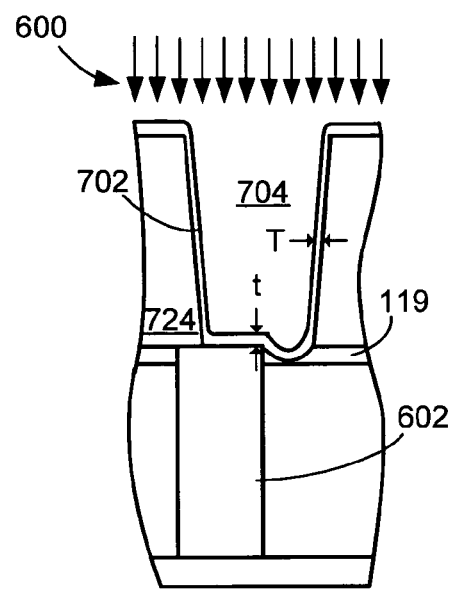
FIG. 7 is a cross-sectional view along line 7-7 of FIG. 6 of the integrated circuit contact system in a first high power deposition phase.

Referring now to FIG. 7, therein is shown a cross-sectional view along line 7-7 of FIG. 6 of the integrated circuit contact system 600 in a first high power deposition phase. A first barrier layer 702 is deposited in a dielectric 724 using a first high power deposition process after the contact plug 602 is formed. The first high power deposition process deposits approximately 200 angstroms of the first barrier layer 702 above the contact plug 602 and into a trench 704 in the dielectric 724.

Further, the first high power deposition process provides high bottom step coverage, approximately 70% to 85%, to a thickness of "t" of the first barrier layer 702 inside the trench 704 and above the contact plug 602. Yet further, the first high power deposition process provides a low sidewall step coverage of the first barrier layer 702, approximately 10% to 20% to a thickness of "T", due to small interconnect line width and tall interconnect feature height.

Figure 8:
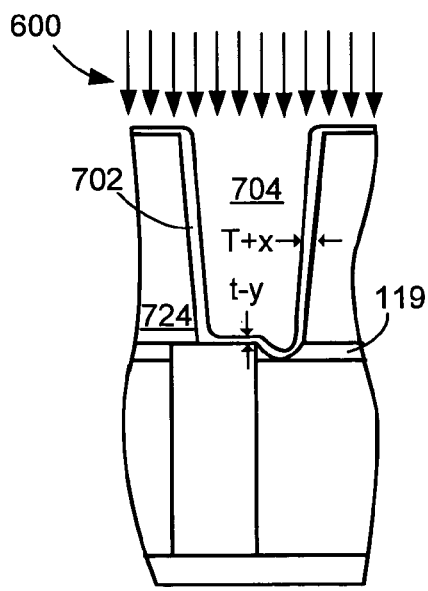
FIG. 8 is a cross-sectional view of the structure of FIG. 7 of the integrated circuit contact system in a re-sputtering phase.

Referring now to FIG. 8, therein is shown a cross-sectional view of the structure of FIG. 7 of the integrated circuit contact system 600 in a re-sputtering phase. To compensate for the low sidewall step coverage of the first high power deposition process, the first barrier layer 702 is re-sputtered.

The re-sputtering process provides re-sputtering or dig out of approximately 55 angstroms, to a thickness of "t" minus "y", of the first barrier layer 702 from the existing bottom thickness of the first barrier layer 702. The re-sputtered or dug out material of the first barrier layer 702 is applied to the sidewall of the first barrier layer 702 to a thickness of "T"+"x" to compensate for the low sidewall step coverage of the first high power deposition. The resulting bottom layer thickness of the first barrier layer 702 is significantly thinner at the bottom corners resulting in low bottom corner step coverage.

Figure 9:
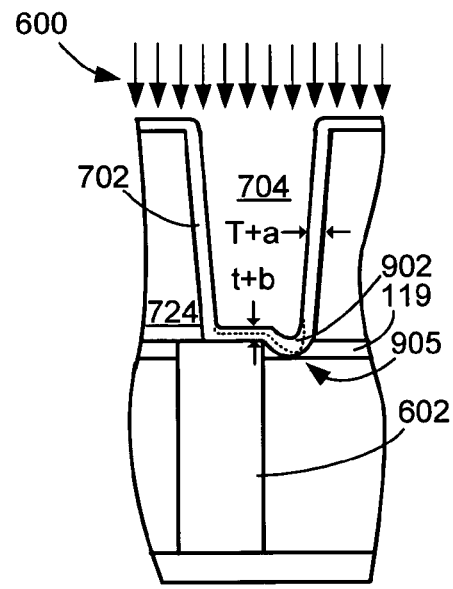
FIG. 9 is a cross-sectional view of the structure of FIG. 8 of the integrated circuit contact system in a second high power deposition phase.

Referring now to FIG. 9, therein is shown a cross-sectional view of the structure of FIG. 8 of the integrated circuit contact system 600 in a second high power deposition phase. For low bottom corner step coverage, a second barrier layer 902 is applied using a second high power deposition process. The second high power deposition process deposits approximately 75 angstroms to 200 angstroms, to a thickness of "t" plus "b", of the second barrier layer 902 on the first barrier layer 702 above the contact plug 602.

The second barrier layer 902 is applied such that material is substantially applied to the bottom of the trench 704 and minimally applied to the sidewalls of the first barrier layer 702 to a thickness of "T" plus "a". The second high power deposition provides high bottom step coverage to compensate for the low bottom corner step coverage as well as low sidewall step coverage to control sheet resistance. Thus, the barrier material fills a corner area 905 of the trench 704, which is defined as being below the top of the contact plug 602.

Figure 10:
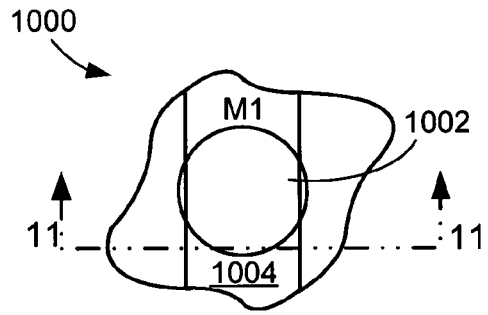
FIG. 10 is a top plan view of an integrated circuit contact system having a contact plug with a narrow interconnect layer in an alternative embodiment of the present invention.

Referring now to FIG. 10, therein is shown a top plan view of an integrated circuit contact system 1000 having a contact plug 1002 with a narrow interconnect layer 1004 in an alternative embodiment of the present invention. The narrow interconnect layer 1004 may be intentional, such as a design requirement, or not, such as a result of processing variation. The narrow width may also provide improvements for low-speed signals, delay paths, area sensitive paths and cross-coupling sensitive signals. The narrow width may also increase reliability concerns and processing complexity. The narrow interconnect layer 1004 partially overlaps the contact plug 1002 on the edge or edges wherein the narrow interconnect layer 1004 extends to connect with other circuitry.

Figure 11:
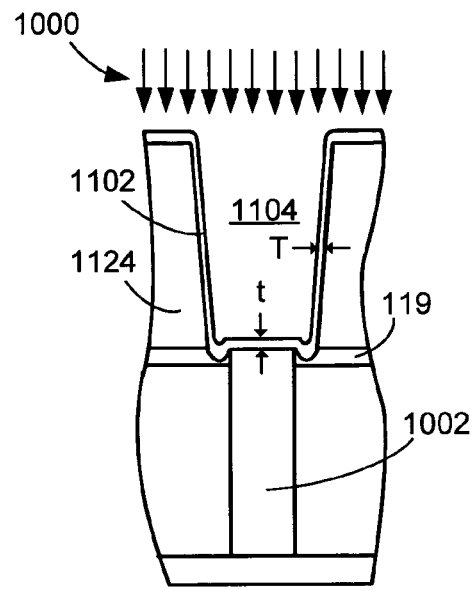
FIG. 11 is a cross-sectional view along line 11-11 of FIG. 10 of the integrated circuit contact system in a first high power deposition phase.

Referring now to FIG. 11, therein is shown a cross-sectional view along line 11-11 of FIG. 10 of the integrated circuit contact system 1000 in a first high power deposition phase. A first barrier layer 1102 is deposited in a dielectric 1124 using a first high power deposition process after the contact plug 1002 is formed. The first high power deposition process deposits approximately 200 angstroms of the first barrier layer 1102 above the contact plug 1002 and into a trench 1104 of the dielectric 1124. Further, the first high power deposition process provides high bottom step coverage, approximately 70% to 85% to a thickness of "t", of the first barrier layer 1102 inside the trench 1104 and above the contact plug 1002. Yet further, the first high power deposition process provides a low sidewall step coverage of the first barrier layer 1102, approximately 10% to 20% to a thickness of "T", due to small interconnect line width and tall interconnect feature height.

Figure 12:
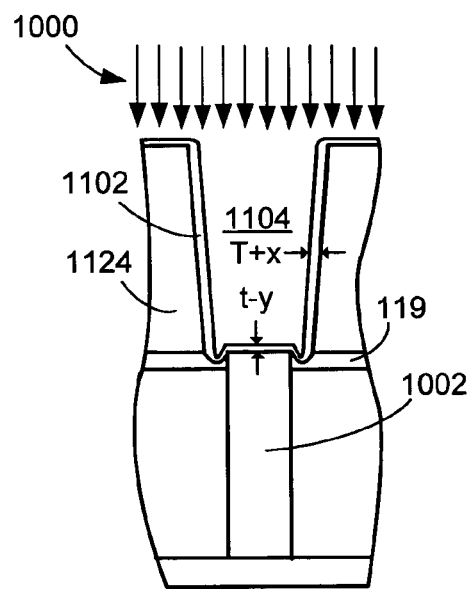
FIG. 12 is a cross-sectional view of the structure of FIG. 11 of the integrated circuit contact system in a re-sputtering phase.

Referring now to FIG. 12, therein is shown a cross-sectional view of the structure of FIG. 11 of the integrated circuit contact system 1000 in a re-sputtering phase. To compensate for the low sidewall step coverage of the first high power deposition process, the first barrier layer 1102 is re-sputtered. The re-sputtering process provides re-sputtering or dig out of approximately 55 angstroms, to a thickness of "t" minus "y", of the first barrier layer 1102 from the existing bottom thickness of the first barrier layer 1102. The re-sputtered or dug out material of the first barrier layer 1102 is applied to the sidewall of the first barrier layer 1102 to a thickness of "T"+"x", of the first barrier layer 1102 to compensate for the low sidewall step coverage of the first high power deposition. The resulting bottom layer thickness of the first barrier layer 1102 is significantly thinner at the bottom corners resulting in low bottom corner step coverage.

Figure 13:
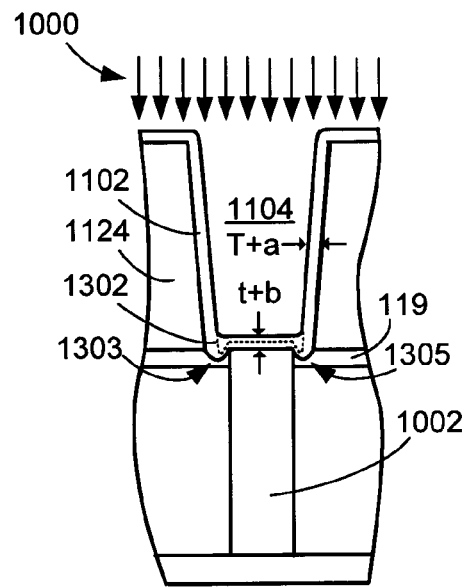
FIG. 13 is a cross-sectional view of the structure of FIG. 12 of the integrated circuit contact system in a second high power deposition phase.

Referring now to FIG. 13, therein is shown a cross-sectional view of the structure of FIG. 12 of the integrated circuit contact system 1000 in a second high power deposition phase. For low bottom corner step coverage, a second barrier layer 1302 is applied using a second high power deposition process.

The second high power deposition process deposits approximately 75 angstroms to 200 angstroms, to a thickness of "t" plus "b", of the second barrier layer 1302 on the first barrier layer 1102 above the contact plug 1002. The second barrier layer 1302 is applied such that material is substantially applied to the bottom of the trench 1104 and minimally applied to the sidewalls of the first barrier layer 1102 to a thickness of "T" plus "a". The second high power deposition provides high bottom step coverage to compensate for the low bottom corner step coverage as well as low sidewall step coverage to control sheet resistance. Thus, the barrier material fills corner areas 1303 and 1305 of the trench 1104, which are defined as being below the top of the contact plug 1002.

Figure 14:
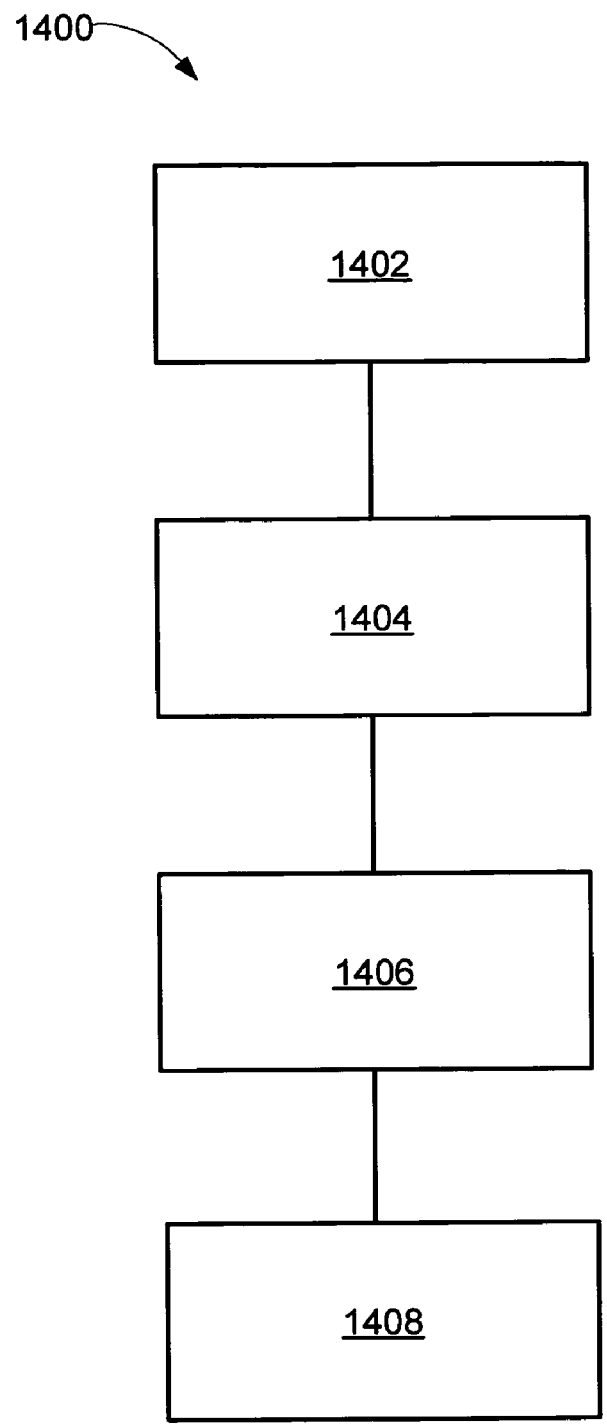
FIG. 14 is a flow chart of an integrated circuit contact system for manufacturing an integrated circuit contact system in an embodiment of the present invention.

Referring now to FIG. 14, therein is shown a flow chart of an integrated circuit contact system 1400 for manufacturing the integrated circuit contact system 102 in an embodiment of the present invention. The system 1400 includes forming a contact plug in a dielectric in a block 1402; forming a first barrier layer in a trench in the dielectric and on the contact plug in a block 1404; removing a portion of the first barrier layer from the bottom of the first barrier layer and depositing the portion of the first barrier layer on the sidewall of the first barrier layer in a block 1406; and forming a second barrier layer over the first barrier layer and filling a corner area of the trench in a block 1408.

In greater detail, a method to fabricate the integrated circuit contact system 102, in an embodiment of the present invention, is performed as follows:

1. The contact plug 202 is formed in a dielectric. (FIG. 3)
2. The first barrier layer 302 is deposited on the contact plug 202 using high power deposition. (FIG. 3)
3. The dug out material of the first barrier layer 302 is re-sputtered such that the dug out material is applied to a sidewall of the trench 304. (FIG. 4)
4. The second barrier layer 502 is deposited over the first barrier layer 302 such that the second barrier layer 502 is substantially applied to the bottom of the trench 304 and minimally applied to the sidewall of the trench 304. (FIG. 5)

It has been discovered that the present invention thus has numerous aspects.

An aspect is that the present invention improves integrated circuit reliability. The additional deposition provides improved blocking of the interconnect layer from the dielectric. The interconnect layer blocked from the dielectric improves reliability particularly at elevated temperature and under an electrical field.

It has been discovered that the disclosed structure provides improved electrical properties of the interconnect layer. The additional deposition increases the thickness at the bottom of the trench with limited increases in thickness at the sidewall of the trench. The additional deposition provides improved blocking with limited increases in the sheet resistance of the final interconnect layer.

It has also been discovered that the disclosed structure improves manufacturing yields and processes. The improvement in reliability provides increased integrated circuit yields and reduced integrated circuit testing requirements. The present invention is fully compatible with high volume processing methods and equipment.

Yet another discovery of the disclosed structure is performance and reliability compatible with high demand integrated circuits such as flash memory. The improved electrical interconnect and controlled resistance provides improved performance compatible with high demand integrated circuits. The improved blocking of the interconnect layer provides increased reliability also compatible with high demand integrated circuits.

These and other valuable aspects of the present invention consequently further the state of the technology to at least the next level.

Thus, it has been discovered that the integrated circuit contact system method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficiently and economically manufacturing memory systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method for forming an integrated circuit contact system, the method comprising:
    forming a contact plug in a dielectric;
    forming a first barrier layer in a trench in the dielectric and on the contact plug;
    digging out or resputtering a portion of the first barrier layer situated at a bottom of the trench and depositing the material on a portion of the first barrier layer situated on a sidewall of the trench, thereby causing the portion of the first barrier layer situated at the bottom of the trench to have a reduced, non-zero thickness; and
    forming a second barrier layer over the first barrier layer and filling a corner area of the trench, wherein the corner area of the trench is situated below a top surface of the contact plug.

2. The method of claim 1 further comprising forming a wide interconnect trench to partially overlap the contact plug.

3. The method of claim 1 further comprising forming an offset interconnect layer to overlap the contact plug.

4. The method of claim 1 further comprising forming a narrow interconnect layer to completely overlap the contact plug.

5. The method of claim 1 further comprising:
    forming an interconnect layer of high diffusion metal on the second barrier layer in the trench; and
    forming the second barrier layer of a material to prevent diffusion.

6. A method for forming an integrated circuit contact system, the method comprising:
    forming a contact plug in a dielectric;
    sputtering a first barrier layer in a trench in the dielectric and on the contact plug using a high power sputtering process;

resputtering the first barrier layer to remove a portion of barrier material from a bottom of the trench and to deposit the barrier material on the sidewall of the trench using a high power sputtering process, thereby causing the first barrier layer to have a reduced, non-zero thickness at the bottom of the trench; and sputtering a second barrier over the first barrier layer, the second barrier layer is substantially applied to the first barrier material on the bottom of the trench and minimally applied to the first barrier layer on the sidewall of the trench, and the second barrier layer fills a corner area of the trench using a high power sputtering process, wherein the corner area of the trench is situated below a top surface of the contact plug.

7. The method of claim 6 further comprising forming a wide interconnect trench, wherein the wide interconnect trench substantially overlaps the contact plug and has two corner areas.

8. The method of claim 6 further comprising forming an offset interconnect layer, wherein the offset interconnect layer partially overlaps the contact plug and has a single corner area.

9. The method of claim 6 further comprising forming a narrow interconnect layer, wherein the narrow interconnect layer partially overlaps the contact plug and has corner areas.

10. The method of claim 6 further comprising:
forming an interconnect layer of copper on the second barrier layer in the trench; and
sputtering the first and second barrier layer using tantalum.

* * * * *